United States Patent [19]

Tanaka et al.

[11] Patent Number: 5,009,949
[45] Date of Patent: Apr. 23, 1991

[54] RESIN COMPOSITION AND ELECTRICAL LAMINATE OBTAINED THEREFROM

[75] Inventors: Kazuyuki Tanaka; Etsuji Iwami; Jun Matsuzawa; Yoshiyuki Mukoyama; Norihiko Shibata, all of Hitachi; Akinori Hanawa, Shimotsuma; Mitsuo Yokota, Yuki, all of Japan

[73] Assignee: Hitachi Chemical Company, Ltd., Tokyo, Japan

[21] Appl. No.: 194,918

[22] Filed: May 17, 1988

[30] Foreign Application Priority Data

| May 21, 1987 | [JP] | Japan | 62-124950 |
| Dec. 22, 1987 | [JP] | Japan | 62-324571 |
| Dec. 29, 1987 | [JP] | Japan | 62-334220 |
| Apr. 1, 1988 | [JP] | Japan | 63-82072 |

[51] Int. Cl.$^5$ .............................................. B32B 7/00
[52] U.S. Cl. ..................................... 428/260; 428/251; 428/268; 428/273; 428/290
[58] Field of Search ............... 428/224, 225, 290, 289, 428/260, 273, 272

[56] References Cited

U.S. PATENT DOCUMENTS 3,583,955 6/1971 Holicky et al. .................... 260/78.4

FOREIGN PATENT DOCUMENTS 907460 5/1973 United Kingdom .

OTHER PUBLICATIONS

Chemical Abstracts, vol. 81, 1974, p. 83, abstract No. 13700v, Columbus, Ohio US & GE-A-2 348153, 26-9-72.

*Primary Examiner*—Edith Buffalow
*Attorney, Agent, or Firm*—Antonelli, Terry, Stout & Kraus

[57] ABSTRACT

A resin composition comprising a copolymer (A) having carbon-carbon unsaturated bonds in its side chains, particularly that obtained by reacting a copolymer of alkyl (meth)arylate (0–50 mole %), hydroxy (meth)acrylate (10–50 mole %) and ethylenic unsaturated monomer (0 to 90 mole %) with an unsaturated carboxylic acid or an anhydride thereof, and a monomer (B) copolymerizable with (A) is suitable for producing a laminate for electrical use.

12 Claims, No Drawings

RESIN COMPOSITION AND ELECTRICAL LAMINATE OBTAINED THEREFROM

BACKGROUND OF THE INVENTION

This invention relates to a thermosetting resin composition excellent in curing properties to provide a cured product good in properties, particularly dielectric properties, and a prepreg and an electrical laminate excellent in electrical properties and mechanical properties obtained from said resin composition.

Since phenol resins have good balance in various properties such as electrical properties, mechanical properties, heat resistance, chemical resistance, etc., and are non-expensive, these resins have widely been used in electrical and electronic fields for public uses. Further, epoxy resins which have improved defects of the phenol resins such as the generation of by-products at the time of reaction and badness in adhesiveness have also been used in very wide fields because of excellence in molding properties (small in cure shrinkage).

Phenol resins and epoxy resins, however, have a defect in that a long period of time is necessary for curing due to polycondensation or ion polymerization curing reaction. On the other hand, unsaturated polyester resins are excellent in curing properties. Since the curing reaction of unsaturated polyester resins is carried out by radical polymerization, curing at room temperature becomes possible by properly selecting a catalyst system. But, since a large number of polar groups (carbonyl groups) are contained in the resin skeleton, the resulting cured product easily absorbs moisture. Thus, the unsaturated polyester resins have a defect in that various properties are deteriorated after moisture absorption.

On the other hand, electrical laminates have heretofore been composed of substrates such as paper, glass cloth or the like and a thermosetting resin such as a phenolic resin, epoxy resin, melamine resin, unsaturated polyester resin or the like. As a method for producing them, there is employed a method comprising impregnating the substrate with a liquid of said resin, then laminating the substrates, and curing the resin.

In the case of phenolic resins, epoxy resins and melamine resins, a solution thereof in a suitable solvent is prepared, infiltrated into substrates, and dried by heating to obtain prepregs in B-stage, which are then heated and pressed to obtain a laminate.

Therefore, the solvent which has become useless volatilizes during the production, so that a large-scale equipment is required for recovering or disposing of the solvent. Furthermore, when the prepregs in B-stage are laminated and heated and pressed to be cured, a high-pressure press is needed. For these reasons and so on, the above method is poor in productivity.

In recent years, there has been proposed a production method in which substrates impregnated with an unsaturated polyester resin are laminated and cured under no pressure. This method has a high productivity because of the good curing property of the resin, but is disadvantageous in that when the proportion of styrene is increased in order to improve the electrical characteristics, the mechanical properties of the resulting laminate are deteriorated, for example, the laminate becomes hard and fragile. When the proportion of styrene is reduced, the viscosity is increased, resulting in insufficient infiltration into substrates, or loss of the superiority in electrical characteristics.

SUMMARY OF THE INVENTION

It is an object of this invention to provide a resin composition overcoming the defects of known thermosetting resins mentioned above.

It is another object of this invention to provide a prepreg and an electrical laminate having high productivity and excellent electrical properties and mechanical properties obtained from said resin composition.

This invention provides a resin composition comprising 80 to 20 parts by weight of a copolymer (A) having carbon-carbon unsaturated bonds in its side chains and 20 to 80 parts by weight of a monomer (B) copolymerizable therewith, a total being 100 parts by weight.

This invention also provides an electrical laminate obtained by impregnating one or more substrates with a resin composition comprising 80 to 20 parts by weight of a copolymer (A) having a carbon-carbon unsaturated bond in its side chains and 20 to 80 parts by weight of a monomer (B) copolymerizable therewith, the total amount of the copolymer (A) and the monomer (B) being 100 parts by weight; and curing the resin composition.

This invention further provides a prepreg obtained by impregnating one or more substrates with the resin composition mentioned above.

DESCRIPTION OF THE PREFERRED EMBODIMENTS

In the present specification, the term "electrical laminate" means a plate of usually 0.1 to 15 mm in thickness as electrical insulating laminate or copper-clad laminate for printed circuit, which is used for insulation in electrical equipments, communications equipments, electronic equipments, etc., or in printed circuits thereof.

The copolymer (A) having a carbon-carbon unsaturated bond in its side chains in this invention can be obtained, for example, by using a compound (a) represented by the general formula:

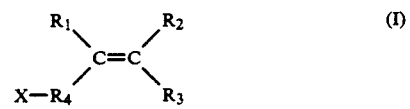

a monomer (b) copolymerizable with the compound (a) and a compound (c) represented by the general formula:

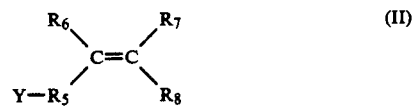

wherein X is a hydroxyl group, an amino group, an epoxy group, a carboxyl group, an isocyanate group, an acid amide group or an acid halide group, X being able to be bonded to C directly, not through $R_4$; Y is a group reactive with X and selected from a hydroxyl group, an amino group, an epoxy group, a carboxyl group, an isocyanate group, an acid amide group and an acid halide group, Y being able to be bonded to C directly, not through $R_5$; $R_1$, $R_2$, $R_6$ and $R_7$ are independently a hydrogen atom, an alkyl group having 1 to 12 carbon atoms, or an aromatic group such as phenyl, phenyl substituted with one or more halogens, alkyls, etc., e.g. chlorophenyl, t-butylphenyl, etc.; $R_4$ and $R_5$ are independently an alkylene group having 1 to 12 carbon atoms, an aromatic group such as phenyl, phenyl substituted with one or more halogens, alkyls, etc., e.g. chlorophenyl, t-butylphenyl, etc., or a direct link when X and/or Y is bonded to C directly; $R_3$ amd $R_8$ are independently the same groups as for X or Y, a hydrogen atom, an alkyl group having 1 to 12 carbon atoms, or an aromatic group such as phenyl, phenyl substituted with one or more halogens, alkyls, etc., e.g. chlorophenyl, t-butylphenyl, etc., $R_3$ being able to form an acid anhydride group when taken together with X, and $R_8$ being able to form an acid anhydride group when taken together with Y; and each of $R_1$ through $R_8$ may contain an oxygen atom, a nitrogen atom, a sulfur atom, a halogen atom, a carboxyl group or a hydroxyl group, polymerizing the compound (a) or copolymerizing the compound (a) with the compound (b), thereby obtaining a polymer, and then reacting this polymer with the compound (c). The compound (b) need not necessarily be used.

Examples of the compound (a) of the above formula (I) in which X is a hydroxyl group, include hydroxyalkyl acylates such as 2-hydroxyethyl acrylate, 2-hydroxypropyl acrylate, 4-hydroxybutyl acrylate, etc.; hydroxyalkyl methacrylates such as 2-hydroxyethyl methacrylate, 2-hydroxypropyl methacrylate, 4-hydroxybutyl methacrylate, etc.; alkyl(2-hydroxyalkyl) esters of itaconic acid such as methyl(2-hydroxyethyl) itaconate, methyl(2-hydroxypropyl) itaconate, ethyl(2-hydroxypropyl) itaconate, etc.; alkyl(2-hydroxyalkyl) esters of maleic acid such as methyl(2-hydroxyethyl) maleate, methyl(2-hydroxypropyl) maleate, ethyl(2-hydroxypropyl) maleate, etc.; alcohols such as allyl alcohol, etc.; β-position alkyl substituted derivatives of these alcohols; hydroxyalkylacrylamides such as hydroxymethylacrylamide hydroxyethylacrylamide, etc.; hydroxyalkylmethacrylamide such as hydroxymethylmethacrylamide, hydroxyethylmethacrylamide, etc.; and compounds containing an aromatic group, such as 1-phenyl-2-hydroxypropene-1,1-phenyl-3-hydroxybutene-1, etc.

Examples of the compound (a) in which X is an amino group include aminostyrenes such as o-aminostyrene, m-aminostyrene, p-aminostyrene, p-amino-α-methylstyrene, etc.; aminoalkylstyrenes such as o-(aminomethyl)styrene, o-(aminoethyl)styrene, 1-phenyl-3-amino-pentene-1,1-phenyl-5-aminopentene-1, etc.; alkyl(aminoalkyl) esters of itaconic acid such as methyl(2-aminoethyl) itaconate, methyl(2-aminopropyl) itaconate, ethyl(2-aminopropyl) itaconate, etc.; and alkyl(aminoalkyl) esters of maleic acid such as methyl(2-aminoethyl) maleate, methyl(2-aminopropyl) maleate, ethyl(2-aminopropyl) maleate, etc.

Examples of the compound (a) in which X is an epoxy group include glycidyl acrylates and methacrylates such as glycidyl acrylate, glycidyl methacrylate, etc., and β-position alkyl substituted derivatives and β-position aromatic substituted derivatives thereof; glycidyl itaconate, glycidyl maleate, and β-position alkyl substituted derivatives and β-position aromatic substituted derivatives thereof; and glycidyl ethers such as allyl glycidyl ether, and β-position alkyl substituted derivatives and β-position aromatic substituted derivatives thereof.

Examples of the compound (a) in which X is a carboxyl group include methacrylic acid, acrylic acid and β-position alkyl substituted derivatives thereof; fumaric acid; maleic acid; itaconic acid; monoalkyl itaconates such as methyl itaconate, ethyl itaconate, propyl itaconate, butyl itaconate, etc.; monoalkyl maleates such as methyl maleate, ethyl maleate, propyl maleate, butyl maleate, etc.; and monoalkyl fumarates such as methyl fumarate, ethyl fumarate, propyl fumarate, etc.

Examples of the compound (a) in which X is an isocyanate group include iscocyanatomethyl acrylate, isocyanatoethyl acrylate, isocyanatomethyl methacrylate, isocyanatoethyl methacrylate, etc.

Examples of the compound (a) in which X is an acid amide group or an acid halide group include compounds having a group such as —COCl, —COBr, —CONH$_2$ or the like which are derived from the above-mentioned compounds (a) in which X is a carboxyl group.

Examples of the compound (a) in which $R_3$ forms an acid anhydride group when taken together with X include itaconic anhydride, maleic anhydride, etc.

The monomer (b) copolymerizable with the compound (a) includes, for example, styrene, styrene derivatives such as α-methylstyrene and the like, organic nitriles such as acrylonitrile, methacrylonitrile and the like, vinyl esters of organic acids such as vinyl acetate, vinyl propionate and the like, acrylic acid, methacrylic acid, alkyl acrylates, alkyl methacrylates, dicyclopentadiene acrylates, N-acrylate derivatives such as N-methylolacrylamide and the like, N-methacrylate derivatives such as N-methylolmethacrylamide, vinyl chloride, vinylidene chloride, etc.

As the compound (c) of the general formula (II), there are selected those in which Y is reactive with X. Substantially, compounds having the following groups are selected from the compounds of the general formula (I). When X is a hydroxyl group, Y is a carboxyl group, an isocyanate group or an acid halide group. When X is an amino group, Y is an epoxy group, a carboxyl group, an isocyanate group or an acid halide group. When X is an epoxy group, Y is an amino group, a carboxyl group, an isocyanate group, an acid amide group or an acid halide group. When X is a carboxyl group, Y is a hydroxyl group, an amino group or an epoxy group. When X is an isocyanate group, Y is a hydroxyl group, an amino group, a carboxyl group or an acid amide group. When X is an acid amide group, Y is an epoxy group, an isocyanate group or an acid halide group. When X is an acid halide group, Y is a hydroxyl group, an amino group, an epoxy group or an acid amide group.

A method for producing a copolymer having a carbon-carbon double bond in its side chain which is composed of these components, includes suspension polymerization, block polymerization, solution polymerization, etc. and is not limited thereto.

Although the ratio of components of the resin composition of this invention can be varied depending on purpose of use and use environment, a preferable range thereof is as follows. The compound (a) is reacted with the compound (c) preferably in an amount equimolar therewith or in a larger amount from the viewpoint of yellowing of resin solution, and the transparency and moisture resistance of resin cured product. As the monomer (b) copolymerizable with the compound (a), there is preferably selected one which has as high a compatibility with the compound (a) and the compound (c) as possible.

A polymerization initiator used for the polymerization of the compound (a) or the copolymerization of the compound (a) and the compound (b) includes those used for usual radical polymerization, for example, azo initiators such as azobisisobutyronitrile, azobiscyclohexanecarbonitrile and the like and peroxides such as tert-butyl hydroperoxide, di-tert-butyl peroxide and the like, and is not limited thereto.

A polymerization inhibitor includes those used for usual radical polymerization, such as hydroquinone, p-benzoquinone, etc., and is not limited thereto.

If necessary, chain transfer agents of alkyl mercaptans such as dodecyl mercaptan can also be used for controlling the molecular weight of the copolymer.

The polymer obtained by the polymerization of the compound (a) or the copolymerization of the compound (a) with the compound (b) is reacted with the compound (c) by a conventional method.

As the monomer (B) which is copolymerizable with the copolymer (A) having a carbon-carbon unsaturated bond in its side chains, the above-mentioned compound (a), monomer (b) or compound (c) is used and the monomer (b) is preferred.

From the viewpoint of the workability of resin composition and the mechanical strength of cured product, the copolymer (A) having a carbon-carbon unsaturated bond in its side chain and the monomer (B) copolymerizable therewith are used in amounts of 80 to 20 parts by weight and 20 to 80 parts by weight, respectively, so as to adjust their total amount to 100 parts by weight.

From the same viewpoint as described above, the copolymer (A) and the monomer (B) are used preferably in amounts of 70 to 50 parts by weight and 30 to 50 parts by weight, respectively, a total amount being 100 parts by weight.

In this invention, it is preferable to use a reaction product (A) of an unsaturated carboxylic acid or an acid anhydride thereof with a copolymer obtained by copolymerizing with one another an alkyl acrylate or an alkyl methacrylate in an amount of 0 to 50 mole %, a hydroxyalkyl acrylate or a hydroxyalkyl methacrylate in an amount of 10 to 50 mole %, and an ethylenic unsaturated monomer other than them in an amount of 0 to 90 mole %, a total amount of these components being 100 mole %.

In another aspect of this invention, the hydroxyalkyl acrylate or hydroxyalkyl methacrylate in which X is a hydroxyl group is selected from the compounds (a) of the general formula [I] mentioned above and used in the above amount range; the alkyl acrylate or alkyl methacrylate is selected from the monomers copolymerizable with the compound (a) mentioned above and used in the above amount range; and the ethylenic unsaturated monomer other than them is selected from the compounds (a), the monomers (b) and the compounds (c) mentioned above and used in the above amount range. These monomers can be used singly or as a mixture thereof.

The other ethylenic unsaturated monomer includes, for example, styrene, styrene derivatives such as α-methylstyrene and the like, organic nitriles such as acrylonitrile, methacrylonitrile and the like, vinyl esters of organic acids such as vinyl acetate, vinyl propionate and the like, acrylic acid, methacrylic acid, acrylic acid esters, methacrylic acid esters, dicyclopentadieneacrylates, compounds having an acid amide group or an acid halide group which are derived from these compounds, N-acrylate derivatives such as N-methylolacrylamide and the like, and N-methacrylate derivatives such as N-methylolmethacrylamide and the like.

A copolymer obtained by copolymerizing these components is reacted with the compound (a) mentioned above, as an unsaturated carboxylic acid or an acid anhydride thereof, in which X is a carboxyl group or formes an acid anhydride group, whereby the reaction product (A) is obtained.

The amount of the alkyl acrylate or alkyl methacrylate is preferably 0 to 50 mole % from the viewpoint of coloration of resin solution and the electrical properties of resin cured product.

The amount of the hydroxyalkyl acrylate or hydroxyalkyl methacrylate is preferably 10 to 50 mole % from the viewpoint of the reactivity and workability of the copolymer.

The amount of the ethylenic unsaturated monomer is preferably 0 to 90 mole % from the viewpoint of white turbidity of resin solution and the transparency of resin cured product.

In the present invention, it is preferable to use a resin composition comprising 80 to 20 parts by weight of the reaction product (A) and 20 to 80 parts by weight of a monomer (B) copolymerizable therewith, the total amount of (A') and (B) being 100 parts by weight, and a polyfunctional crosslinking monomer (C) in an amount of 0.5 part by weight or more per 100 parts by weight of (A)+(B).

In further aspect of this invention, there is used a resin composition using the reaction product (A) in another aspect of this invention and containing a polyfunctional crosslinking monomer (C) in an amount of 0.5 part by weight or more per 100 parts by weight of the reaction product (A) + a monomer (B) copolymerizable therewith.

The polyfunctional crosslinking monomer includes, for example, vinyl monomers such as divinylbenzene, divinyltoluene and the like; polyfunctional acrylates such as 1,3-butylene glycol diacrylate, diethylene glycol diacrylate, trimethylolpropane triacrylate, bisphenol A diacrylate, tris(acryloyloxyethyl) isocyanurate and the like; polyfunctional methacrylates such as 1,3-butylene glycol dimethacrylate, ethylene glycol dimethacrylate, trimethylolpropane trimethacrylate, bisphenol A propane trimethacrylate, bisphenol A dimethacrylate, tris(methacryloyloxyethyl) isocyanurate and the like; and polyfunctional allyl compounds such as diallyl phthalate, triallyl cyanurate, triallyl isocyanurate and the like.

The amount of the polyfunctional crosslinking monomer is 0.5 parts by weight or more per 100 parts by weight of the above-mentioned reaction product (A) + the above-mentioned monomer (B) from the viewpoint of the degree of cure of resin cured product. When it is less than 0.5 part by weight, the degree of cure of the resulting resin cured product is insufficient, so that naturally expectable characteristics cannot be attained. When it is more than 20 parts by weight, the degree of cure of the resulting resin cured product is hardly changed thereby. Therefore, the polyfunctional crosslinking monomer is used preferably in an amount of 20 parts by weight or less.

Employment of the polyfunctional crosslinking monomer in the above amount range results in improved electrical characteristics and mechanical properties of the resulting electrical laminate.

Since the resin compositions mentioned above have relatively low viscosities and can be cured in a short time, these compositions can be used for resins for casting for producing industrial materials (particularly for electrical insulation), materials for civil engineering and construction industry, sporting goods, equipment for leisure time amusement, etc. Further, by adding one or more plasticizers, stabilizers, thickening agents, fillers, cross-linking agents, reinforcing agents, colorants, lubricants, etc., to these resin compositions, they can be used as molding materials, coating compositions, adhesives, and the like.

These resin compositions can also be used for producing electrical laminates as follows.

As the substrate to be impregnated with the resin composition in the present invention, there can be used sheet-like substrates such as glass cloth, glass mat, asbestos cloth, organic fiber, nonwoven fabric, paper, etc.

Particularly when paper such as linter paper, Kraft paper or the like is used as the substrate, a desirable electrical laminate can be obtained.

It is also possible to subject these substrates previously to waterproofing treatment, for example, with a melamine resin such as methylol melamine, methylated methylol melamine or the like, a urea resin such as benzoguanamine, methylol urea or the like, or a water-soluble phenolic resin, followed by impregnation with the resin composition and curing.

The electrical laminate is produced, for example, in the following manner. First, the resin composition is infiltrated into substrates to prepare resin-infiltrated substrates. Next, a plurality of these resin-infiltrated substrates are placed one upon another and laminated by passage between rolls while removing interlaminar gas bubbles. Subsequently, the resulting laminate is heated under no pressure to cure the resin composition, whereby the electrical laminate is obtained. The electrical laminate of this invention can be continuously produced.

For curing the resin composition, organic peroxides can be used as curing catalysts.

The organic peroxides include, for example, tert-butyl perbenzoate, tert-butyl peroxide, benzoyl peroxide, tert-butyl peroctoate, etc.

If necessary, the curing can be controlled by use of curing accelerators or polymerization inhibitors.

Characteristics of the resin composition can be improved by incorporating thereinto plasticizers, stabilizers, thickners, fillers, coloring agents, lubricants, etc.

A copper-clad laminate can be obtained by subjecting substrates impregnated with an uncured resin composition and copper foil to laminated molding to unite them in a body, or by inserting an adhesive between substrates impregnated with an uncured resin and copper foil and then subjecting them to laminated molding to unite them in a body. A copper-clad laminate can be obtained also by preparing a laminate by laminated molding and then unite this laminate and a copper foil laminate in a body through an adhesive.

As the adhessive, epoxy resins, butyral-modified epoxy resins, etc. can be used.

The present invention is illustrated below by way of the following Examples, in which all parts are by weight.

EXAMPLE 1

In a 2-liter flask equipped with a stirrer and a condenser was placed 750 parts of methyl isobutyl ketone (hereinafter abbreviated as MIBK), and heated to 100° C. In a 1-liter beaker were placed 377 parts of styrene (hereinafter abbreviated as STC), 202 parts of 2-hydroxyethyl methacrylate (hereinafter abbreviated as HEMA), 17.4 parts of azobisisobutyronitrile (hereinafter abbreviated as AIBN) and 2.9 parts of di-tert-butyl peroxide (hereinafter abbreviated as DTBP), and after mixing, the whole of the resulting mixture was added dropwise to the heated MIBK over a period of 3 hours. After completion of the dropwise addition, the reaction was carried out for 6 hours. After addition of 0.12 part of hydroquinone (hereinafter abbreviated as HQPC) followed by mixing, 152 parts of maleic anhydride (hereinafter abbreviated as MAC) was added and the resulting mixture was subjected to reaction for another 3 hours. The reaction mixture was cooled after confirmation of substantial agreement of the acid value (measured value: 61) with the calculated value (a value on the assumption that only one of the two carboxyl groups of MAC reacts: 58).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin composition A was obtained. This resin composition was allowed to stand in a vacuum dryer at 80° C. for 2 hours to obtain a resin composition B which was substantially completely free from MIBK. The resin composition B was solid at room temperature.

In a 1-liter flask equipped with a stirrer were placed 300 parts of the resin composition B and 200 parts of STC, and heated at about 50° C. on a water bath to dissolve the resin composition B in STC, after which 2 parts of 50% paste of benzoyl peroxide (hereinafter abbreviated as BPO) was added to obtain a STC solution. High-temperature characteristics (measurement temperature; 80° C.) according to JIS K 6901 of this STC solution were as follows: gelation time 317 seconds, minimum curing time 580 seconds, maximum heat-build-up temperature 148° C. The STC solution was defoamed, poured into a casting mold having a thickness of 3 mm, and then heated in a dryer at 100° C. for 2 hours to obtain a resin cured product. The flexural strength and the flexural modulus according to JIS K 6911 of the resin cured product were 8.8 kgf/mm² and 340 kgf/mm², respectively. The dielectric constant and the dielectric loss tangent according to JIS K 6911 of the resin cured product were measured to show very excellent values as shown in Table 1.

EXAMPLE 2

In a 2-liter flask equipped with a stirrer and a condenser was placed 750 parts of MIBK, and heated to 100° C. In a 1-liter beaker were placed 151 parts of STC, 189 parts of HEMA, 247 parts of n-butyl acrylate, 17.6 parts of AIBN and 2.9 parts of DTBP, and after mixing, the whole of the resulting mixture was added dropwise to the heated MIBK over a period of 3 hours. After completion of the dropwise addition, the reaction was carried out for 6 hours. After addition of 0.12 part of HQPC followed by mixing, 142 parts of MAC was added and the resulting mixture was subjected to reaction for another 3 hours. The reaction mixture was cooled after confirmation of substantial agreement of the acid value (measured value: 55) with the calculated value (54).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin composition A was obtained. This resin composition was allowed to stand in a vacuum dryer at 80° C. for 2 hours to obtain a resin composition B which was substantially completely free from MIBK. The resin composition B was semisolid at room temperature.

In a 1-liter flask equipped with a stirrer were placed 300 parts of the resin composition B and 200 parts of STC, and heated at about 50° C. on a water bath to dissolve the resin composition B in STC, after which 2 parts of 50% paste of BPO was added to obtain a STC solution. High-temperature curing characteristics (measurement temperature: 80° C.) according to JIS K 6901 of this STC solution were as follows: gelation time 230 seconds, minimum curing time 448 seconds, maximum heat-build-up temperature 182° C. The STC solution was defoamed, poured into a casting mold having a thickness of 3 mm, and then heated in a dryer at 100° C. for 2 hours to obtain a resin cured product. The flexural strength and the flexural modulus according to JIS K 6911 of the resin cured product were 11.0 kgf/mm² and 310 kgf/mm², respectively. The dielectric constant and the dielectric loss tangent according to JIS K 6911 of the resin cured product were measured to show very excellent values as shown in Table 1.

EXAMPLE 3

In a 2-liter flask equipped with a stirrer and a condenser was placed 750 parts of MIBK, and heated to 100° C. In a 1-liter beaker were placed 200 parts of STC, 175 parts of HEMA, 222 parts of 2-ethylhexyl acrylate, 17.9 parts of AIBN and 3.0 parts of DTBP, and after mixing, the whole of the resulting mixture was added dropwise to the heated MIBK over a period of 3 hours. After completion of the dropwise addition, the reaction was carried out for 6 hours. After addition of 0.12 part of HQPC followed by mixing, 132 parts of MAC was added and the resulting mixture was subjected to reaction for another 3 hours. The reaction mixture was cooled after confirmation of substantial agreement of the acid value (measured value: 52) with the calculated value (50).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin composition A was obtained. This resin composition was allowed to stand in a vacuum dryer at 80° C. for 2 hours to obtain a resin composition B which was substantially completely free from MIBK. The resin composition B was a viscous liquid at room temperature.

In a 1-liter flask equipped with a stirrer were placed 300 parts of the resin composition B and 200 parts of STC, and heated at about 50° C. on a water bath to dissolve the resin composition B in STC, after which 2 parts of 50% paste of BPO was added to obtain a STC solution. High-temperature curing characteristics (measurement temperature: 80° C.) according to JIS K 6901 of this STC solution were as follows: gelation time 214 seconds, minimum curing time 404 seconds, maximum heat-build-up temperature 194° C. The STC solution was defoamed, poured into a casting mold having a thickness of 3 mm, and then heated in a dryer at 100° C. for 2 hours to obtain a resin cured product. The flexural strength and the flexural modulus according to JIS K 6911 of the resin cured product were 8.7 kgf/mm² and 280 kgf/mm², respectively. The dielectric constant and the dielectric loss tangent according to JIS K 6911 of the resin cured product were measured to show very excellent values as shown in Table 1.

COMPARATIVE EXAMPLE 1

An unsaturated polyester resin solution was obtained by homogeneously blending 60 parts of an unsaturated polyester resin obtained by condensation by heating at 210° C. of 0.4 mole of MAC, 0.6 mole of isophthalic acid and 1.1 moles of diethylene glycol with 30 parts of STC containing 0.01 part of HQPC in solution. To this resin solution was added 2 parts of 50% paste of BPO, and a resin cured product was obtained in the same manner as in Examples 1 to 3. The flexural strength and the flexural modulus according to JIS K 6911 of the resin cured product were 7.8 kgf/mm² and 260 kgf/mm², respectively. The measurement results of the dielectric constant and the dielectric loss tangent according to JIS K 6911 of the resin cured product are shown in Table 1.

TABLE 1

| Item | Dielectric loss tangent and dielectric constant of various resin cured product | | | |
|---|---|---|---|---|
| | Example 1 | Example 2 | Example 3 | Comparative Example 1 |
| Dielectric loss tangent | | | | |
| 110 Hz | 0.007 | 0.006 | 0.010 | 0.020 |
| 1 KHz | 0.008 | 0.007 | 0.015 | 0.016 |
| 10 KHz | 0.009 | 0.009 | 0.016 | 0.015 |
| 100 KHz | 0.013 | 0.014 | 0.018 | 0.021 |
| 1 MHz | 0.015 | 0.018 | 0.021 | 0.029 |
| Dielectric constant | | | | |
| 110 Hz | 3.5 | 3.3 | 3.5 | 4.1 |
| 1 KHz | 3.5 | 3.2 | 3.4 | 4.0 |
| 10 KHz | 3.4 | 3.2 | 3.3 | 3.9 |
| 100 KHz | 3.4 | 3.1 | 3.3 | 3.8 |
| 1 MHz | 3.3 | 3.1 | 3.2 | 3.7 |

As can be seen from the results shown in Table 1, the resin compositions obtained in Examples 1 to 3 have very excellent dielectric properties. Particularly in the high frequency range, they show lower values as compared even with the unsaturated polyester resin shown in Comparative Example 1 which is excellent in high-frequency characteristics among conventional resins for electrical insulation, indicating that they are excellent in dielectric properties (particularly in the high frequency range).

EXAMPLE 4

In a 2-liter flask equipped with a stirrer and a condenser was placed 750 parts of MIBK, and heated to 100° C. In a 1-liter beaker were placed 378 parts of STC, 186 parts of methacrylic acid (hereinafter referred to as MAA), 186 parts of n-butyl acrylate, 17.6 parts of AIBN and 29 parts of DTBP, and after mixing, the whole of the resulting mixture was added dropwise to the heated MIBK over a period of 3 hours. After completion of the dropwise addition, the reaction was carried out for 6 hours, and 0.12 part of HQPC was added, followed by mixing. Then, 290 parts of glycidyl methacrylate and 10 parts of trimethylbenzylammonium chloride were added, and the resulting mixture was subjected to reaction for another 5 hours. The reaction mixture was cooled at the time when an acid value (measured value: 14) was reached.

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin composition was obtained.

The resin composition was allowed to stand in a vacuum dryer at 60° C. for 3 hours to obtain a resin composition which was substantially completely free from MIBK. This resin composition was semisolid at room temperature.

In a 1-liter flask equipped with a stirrer were placed 300 parts of this resin composition and 200 parts of STC, and heated at about 50° C. on a water bath to dissolve the resin composition in STC, after which 2 parts of 50% paste of BPO was added to obtain a resin composition E.

High-temperature curing characteristics (measurement temperature: 80° C.) according to JIS K 6901 of the resin composition E are shown in Table 2.

The resin composition E was defoamed, poured into a casting mold having a thickness of 3 mm, and then heated in a dryer at 100° C. for 2 hours to obtain a resin cured product.

The measurement results of the water absorption and the dielectric properties according to JIS K 6911 of the resin cured product are shown in Table 2.

EXAMPLE 5

In a 2-liter flask equipped with a stirrer and a condenser was placed 750 parts of MIBK, and heated to 100° C. In a 1-liter beaker were placed 377 parts of STC, 202 parts of HEMA, 17.4 parts of AIBN and 2.9 parts of DTBP, and after mixing, the whole of the resulting mixture was added dropwise to the heated MIBK over a period of 3 hours. After completion of the dropwise addition, the reaction was carried out for 6 hours, and 0.12 part of HQPC was added, followed by cooling.

The flask was connected to an aspirator, and the contents of the flask was heated at 80° to 100° C. while reducing the pressure to about 250 mmHg by means of the aspirator, to remove the MIBK. The pressure was further reduced to 5 mmHg by means of a vacuum pump to remove the MIBK completely.

The resin composition thus obtained was cooled to 60° C. and sufficiently dissolved in 440 parts of STC previously dehydrated by use of calcium chloride. At the time when a STC solution at 60° C. had been formed, 1.0 part of dibutyltin dilaurate was placed in the flask, after which 63 parts of isocyanatoethyl methacrylate was added dropwise over a period of about 30 minutes. Thereafter, the resulting mixture was stirred for 30 minutes while keeping the same warm, and then cooled.

Thereto was further added 2 parts of 50% paste of BPO to obtain a resin composition F.

High-temperature curing characteristics (measurement temperature: 80° C.) according to JIS K 6901 of the resin composition F are shown in Table 2.

The resin composition F was defoamed, poured into a casting mold having a thickness of 3 mm, and then heated in a dryer at 100° C. for 2 hours to obtain a resin cured product.

The measurement results of the water absorption and the dielectric properties according to JIS K 6911 of the resin cured product are shown in Table 2.

TABLE 2

| Item | | Unit | Example 4 | Example 5 |
| --- | --- | --- | --- | --- |
| High-temperature | tg | S | 283 | 306 |
| curing | tc | S | 340 | 370 |

TABLE 2-continued

| Item | Unit | Example 4 | Example 5 |
| --- | --- | --- | --- |
| characteristics (80° C.) Tmax | °C. | 160 | 140 |
| Water absorption | 23° C. % | 0.31 | 0.38 |
| Dielectric loss tangent | 1 MHz | 0.020 | 0.023 |
| Dielectric constant | 1 MHz | 3.1 | 3.3 |

EXAMPLES 6 to 14

In a 300-ml flask equipped with a stirrer, heating device, a condenser, a nitrogen gas inlet, and monomer inlet was placed 100 parts of methyl isobutyl ketone (hereinafter abbreviated as MIBK), and heated to 100° C. while replacing the air in the flask sufficiently with nitrogen. In a 200-ml beaker were placed each component A listed in Table 3, 3 parts of azobisisobutyronitrile and 0.5 part of di-tert-butyl peroxide, and after sufficient mixing, the whole of the resulting mixture was continuously added to the heated MIBK over a period of 3 hours. After completion of the addition of the whole mixture, the reaction was carried out for another 3 hours, and 0.02 part of hydroquinone was added, followed by mixing, whereby 9 copolymers were prepared. The component B (maleic anhydride) listed in Table 3 was further added to each mixture thus obtained, while maintaining the temperature of the mixture at 100° C., and the resulting mixture was subjected to reaction for 4 hours and then cooled. The polymerization conversions of the reaction mixtures thus obtained were all 90% or more.

Subsequently, a condenser was attached to the flask, and each reaction mixture was heated at 80° to 100° C. while reducing the pressure by means of an aspirator gradually to about 50 mmHg, to remove the MIBK. Then, each component C listed in Table 3 containing 0.02 part of hydroquinone previously dissolved therein was added, and stirring was continued until the residue was sufficiently dissolved. After it was confirmed that no insoluble material existed, the solution thus obtained was cooled, whereby 9 resin compositions were obtained.

With 100 parts of each resin composition was sufficiently mixed 1 part of Perhexa 3M (a peroxyketal, a trade name, mfd. by Nippon Oils and Fats Co., Ltd.), and then high-temperature curing characteristics (measurement temperature: 100° C.) of the resulting composition were measured according to JIS K 6901. The measurement results are shown in Table 4. In Table 4, tg denotes gelation time, tc minimum curing time, and Tmax maximum heat-build-up temperature. In addition, each resin composition incorporated with Perhexa 3M in the same manner as described above was defoamed, poured into a casting mold having a thickness of 3 mm, and then heated in a dryer at 100° C. for 2 hours to obtain a resin cured product. The measurement results of the water absorption and the dielectric properties according to JIS K 6911 of the resin cured product are shown in Table 4.

COMPARATIVE EXAMPLE 2

An unsaturated polyester resin solution was obtained by homogeneously blending 60 parts of an unsaturated polyester resin obtained by condensation by heating at 210° C. of 0.4 mole of maleic anhydride, 0.6 mole of isophthalic acid and 1.1 moles of diethylene glycol with 30 parts of styrene containing 0.01 part of hydroquinone previously dissolved therein. With this resin solution were mixed 0.5 part of Percure 0 (a peroxy ester, a trade name, mfd. by Nippon Oils and Fats Co., Ltd.) and 1.5 parts of Perbutyl Z (a peroxy ester, a trade name, mfd. by Nippon Oils and Fats Co., Ltd.), and then high-temperature curing characteristics of the resulting composition and the water absorption and dielectric properties of resin cured product were measured in the same manner as in Examples 6 to 14. The results obtained are shown in Table 4.

quency characteristics among conventional resins, indicating that their dielectric properties are very excellent.

EXAMPLE 15

In a 3-liter flask equipped with a stirrer, a heating device, a condenser, a nitrogen gas inlet, and monomer inlet was placed 556 parts of methyl isobutyl ketone (hereinafter abbreviated as MIBK), and heated to 100° C. while replacing the air in the flask sufficiently with nitrogen. On the other hand, 358.3 parts (30 mole %) of styrene, 587.6 parts (40 mole %) of butyl acrylate, 447.9 parts (30 mole %) of 2-hydroxyethyl methacrylate,

TABLE 3

| Example | 6 | 7 | 8 | 9 | 10 |
|---|---|---|---|---|---|
| A | | | | | |
| Styrene | 22 (30 mole %) | 19 (30 mole %) | 25 (30 mole %) | 21 (30 mole %) | 22 (30 mole %) |
| Butyl acrylate | 36 (40 mole %) | | | | |
| 2-Ethylhexyl acrylate | | 45 (40 mole %) | | | |
| Methyl methacrylate | | | 30 (40 mole %) | | |
| Butyl methacrylate | | | | 39 (40 mole %) | |
| 2-Hydroxyethyl methacrylate | 28 (30 mole %) | 24 (30 mole %) | 30 (30 mole %) | 27 (30 mole %) | 28 (30 mole %) |
| B | | | | | |
| Maleic anhydride | 14 | 12 | 15 | 13 | 14 |
| C | | | | | |
| Styrene | 100 | 100 | 100 | 100 | |
| α-Methylstyrene | | | | | 100 |

| Example | 11 | 12 | 13 | 14 |
|---|---|---|---|---|
| A | | | | |
| Styrene | 22 (30 mole %) | 23 (30 mole %) | 23 (30 mole %) | 20 (30 mole %) |
| Butyl acrylate | 36 | 37 | 37 | |
| 2-Ethylhexyl acrylate | | | | 46 |
| 2-Hydroxyethyl methacrylate | 28 (30 mole %) | | | |
| 2-Hydroxyethyl acrylate | | 25 (30 mole %) | 25 (30 mole %) | 22 (30 mole %) |
| B | | | | |
| Maleic anhydride | 14 | 15 | 15 | 12 |
| C | | | | |
| Styrene | 80 | 100 | 80 | 100 |
| Butyl acrylate | 20 | | 20 | |

(the unit of the figures: parts by weight)

TABLE 4

| Item | | Kind | Example 6 | 7 | 8 | 9 | 10 | 11 | 12 | 13 | 14 | Comparative Example 2 |
|---|---|---|---|---|---|---|---|---|---|---|---|---|
| High-temperature curing characteristics (80° C.) | tg | s | 273 | 261 | 255 | 266 | 303 | 345 | 293 | 318 | 281 | 378 |
| | tc | s | 359 | 340 | 334 | 345 | 389 | 440 | 379 | 407 | 368 | 498 |
| | Tmax | °C. | 172 | 173 | 178 | 167 | 171 | 180 | 175 | 183 | 174 | 209 |
| Water absorption | 23° C. | % | 0.35 | 0.36 | 0.37 | 0.36 | 0.37 | 0.35 | 0.32 | 0.33 | 0.33 | 0.40 |
| Dielectric loss tangent | 1 MHz | | 0.013 | 0.015 | 0.012 | 0.015 | 0.020 | 0.020 | 0.012 | 0.018 | 0.013 | 0.029 |
| Dielectric constant | 1 MHz | | 3.0 | 2.9 | 2.8 | 2.9 | 3.3 | 3.2 | 3.0 | 3.2 | 3.0 | 3.7 |

As shown in Table 4, the 9 resin compositions obtained in Examples have excellent curing characteristics, show a relatively low water absorption, and have excellent water resistance.

Furthermore, their dielectric properties shows lower values as compared even with unsaturated polyester resins (UP) which are particularly excellent in high-frequency 41.86 parts of azobisisobutyronitrile and 6.96 parts of di-tert-butyl peroxide were placed in a 2-liter beaker, and after sufficient stirring, the resulting mixture was added dropwise to the heated MIBK so as to exhaust the whole of the mixture in 3 hours. After completion of the dropwise addition of the whole mixture, the reaction was carried out for another 3 hours, and 0.27 part of hydroquinone was added, followed by mixing, whereby a copolymer (A) was obtained. Then, 225 parts of maleic anhydride was added while maintaining the temperature at 100° C., and the resulting mixture was subjected to reaction for 4 hours. Thereafter, the reaction mixture was cooled after it was confirmed that the polymerization conversion was 98%.

Subsequently, a condenser was attached to the flask, and the reaction mixture was heated at 80° to 100° C. while reducing the pressure by means of an aspirator gradually to about 50 mmHg, to remove the MIBK. Then, 1618.8 parts of styrene containing 0.02 part of hydroquinone previously dissolved therein was added, and stirring was continued until the copolymer (A) was completely dissolved. After it was confirmed that no insoluble material existed, the solution thus obtained was cooled to obtain a resin composition (B). The nonvolatile content (NV) of the resin composition (B) was about 52.

Divinylbenzene was added to 100 parts of the resin composition (B) in each amount of 20 parts or less as shown in Table 5, followed by adding thereto 1 part of Perhexa 3M (a peroxyketal, a trade name, mfd. by Nippon Oils and Fats Co., Ltd.). After sufficient stirring and mixing, high-temperature characteristics (measurement temperature 130° C.: in Table 5, Tg denotes gelation time, Tc minimum curing time, and Tmax maximum heat-build-up temperature) of the resulting composition were measured according to JIS K 6901. This composition was still heated, and after 30 minutes, it was rapidly cooled to obtain a resin cured product. The resin cured product was finely ground, and about 3 g of the ground cured product was placed in a timble having a diameter of 28 mm and a length of 100 mm whose weight has previously been made constant by drying. The thimble containing the ground cured product was precisely weighed and then subjected to extraction under reflux for 4 hours by means of a Soxhlet extractor using acetone (100 g) as solvent. After the extraction, the thimble was dried in a vacuum dryer at 60° C. for 4 hours and the acetone extraction rate was calculated from the difference of the weights of the thimble before and after the extraction and drying. The filtrate was subjected as such to quantitative analysis for unreacted styrene monomer by means of a gas-chromatographic apparatus (Hitachi Model 164), and the amount of residual styrene was calculated from the analysis result. The results obtained are summarized in Table 5.

EXAMPLE 16

Ethylene glycol dimethacrylate was added to 100 parts of the resin composition (B) prepared in Example 15, in each amount of 20 parts or less as shown in Table 6, followed by adding thereto 1 part of Perhexa 3M (a peroxyketal, a trade name, mfd. by Nippon Oils and Fats Co., Ltd.). After sufficient stirring and mixing, high-temperature curing characteristics (130° C.) of the resulting composition, the acetone extraction and the amount of residual styrene were measured in the same manner as in Example 15. The results obtained are summarized in Table 6.

EXAMPLE 17

Triallyl isocyanurate was added to 100 parts of the resin composition (B) prepared in Example 15, in each amount of 20 parts or less as shown in Table 7, followed by adding thereto 1 part of Perhexa 3M (a peroxyketal, a trade name, mfd. by Nippon Oils and Fats Co., Ltd.). After sufficient stirring and mixing, high-temperature curing characteristics (130° C.) of the resulting composition, the acetone extraction rate, and the amount of residual styrene were measured in the same manner as in Example 15. The results obtained are summarized in Table 7.

COMPARATIVE EXAMPLE 3

To 100 parts of the resin composition prepared in Example 15 was added 1 part of Perhexa 3M (a peroxyketal, a trade name, mfd. by Nippon Oils and Fats Co., Ltd.) but not divinylbenzene, ethylene glycol dimethacrylate and triallyl isocyanurate. After sufficient stirring and mixing, high-temperature characteristics (130° C.) of the resulting composition, the acetone extraction rate and the amount of residual styrene were measured in the same manner as in Example 15. The results obtained are shown in Tables 5 to 7.

TABLE 5

| Adding amount (parts) | High-temperature curing characteristics | | | Acetone extraction rate (%) | Amount of residual styrene (%) |
|---|---|---|---|---|---|
| | Tg (sec) | Tc (sec) | Tmax (°C.) | | |
| 0 | 118 | 170 | 235 | 17.9 | 0.13 |
| 0.5 | 115 | 166 | 235 | 13.3 | 0.12 |
| 1.0 | 116 | 158 | 247 | 11.1 | 0.11 |
| 2.5 | 116 | 152 | 253 | 9.5 | 0.094 |
| 5.0 | 115 | 151 | 266 | 8.5 | 0.078 |
| 10.0 | 122 | 151 | 277 | 7.0 | 0.063 |
| 20.0 | 120 | 150 | 283 | 6.8 | 0.061 |

TABLE 6

| Adding amount (parts) | High-temperature curing characteristics | | | Acetone extraction rate (%) | Amount of residual styrene (%) |
|---|---|---|---|---|---|
| | Tg (sec) | Tc (sec) | Tmax (°C.) | | |
| 0 | 118 | 170 | 235 | 17.9 | 0.13 |
| 0.5 | 118 | 169 | 237 | 13.2 | 0.12 |
| 1.0 | 119 | 168 | 243 | 12.1 | 0.11 |
| 2.5 | 121 | 165 | 250 | 10.0 | 0.094 |
| 5.0 | 123 | 162 | 258 | 9.2 | 0.088 |
| 10.0 | 125 | 161 | 268 | 8.5 | 0.076 |
| 20.0 | 125 | 160 | 270 | 8.3 | 0.075 |

TABLE 7

| Adding amount (parts) | High-temperature curing characteristics | | | Acetone extraction rate (%) | Amount of residual styrene (%) |
|---|---|---|---|---|---|
| | Tg (sec) | Tc (sec) | Tmax (°C.) | | |
| 0 | 118 | 170 | 235 | 17.9 | 0.13 |
| 0.5 | 122 | 174 | 239 | 15.8 | 0.12 |
| 1.0 | 125 | 178 | 243 | 14.1 | 0.12 |
| 2.5 | 129 | 182 | 247 | 11.0 | 0.11 |
| 5.0 | 133 | 186 | 253 | 9.9 | 0.10 |
| 10.0 | 138 | 190 | 257 | 9.0 | 0.093 |
| 20.0 | 140 | 193 | 261 | 8.8 | 0.086 |

As shown in Tables 5 to 7, the resin compositions obtained in Examples have excellent curing characteristics. Particularly when divinylbenzene is used, the minimum curing time (Tc) is 5 to 20 seconds shorter than when it is not added, namely, curing can be achieved in a shorter time. Moreover, both the acetone extraction rate and the amount of residual styrene which are measures of the degree of cure are rapidly decreased with an increase of the adding amount of tetrafunctional or higher-order crosslinking monomer. Particularly when divinylbenzene is used, their values are the smallest at the same adding amounts, indicating that more improved curing property can be attained in this case.

The resin composition of the present invention have excellent curing property and can give a molded product excellent in mechanical properties and electrical characteristics.

The resin composition of the present invention can be cured in a short time because its curing reaction is of radical polymerization type and it is relatively rich in reactivity. Moreover, a large amount of a polymerizable monomer excellent in electrical properties can be introduced into not only the crosslinking portion but also the main chain skeleton portion, and therefore electrical properties (in particular, dielectric properties) of the resulting resin cured product have excellent values as compared with conventional resins such as phenolic resins, unsaturated polyester resins, etc.

Furthermore, a more firmly cured molded product can be obtained by use of a polyfunctional crosslinking monomer.

EXAMPLE 18

In a 2-liter flask equipped with a stirrer and a condenser was placed 750 parts of methyl isobutyl ketone (hereinafter abbreviated as MIBK), and heated to 100° C. In a 1-liter beaker were placed 377 parts of styrene (hereinafter abbreviated as STC), 202 parts of 2-hydroxyethyl methacrylate (hereinafter abbreviated as HEMA), 17.4 parts of azobisisobutyronitrile (hereinafter abbreviated as AIBN) and 2.9 parts of di-tert-butyl peroxide (hereinafter abbreviated as DTBP), and after mixing, the whole of the resulting mixture was added dropwise to the heated MIBK over a period of 3 hours. After completion of the dropwise addition, the reaction was carried out for 6 hours. After addition of 0.12 part of hydroquinone (hereinafter abbreviated as HQPC) followed by mixing, 152 parts of maleic anhydride (hereinafter abbreviated as MAC) was added and the resulting mixture was subjected to reaction for another 3 hours. The reaction mixture was cooled after confirmation of substantial agreement of the acid value (measured value: 61) with the calculated value (a value on the assumption that only one of the two carboxyl groups of MAC reacts: 58).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin was obtained. The resin was allowed to stand in a vacuum dryer at 80° C. for 2 hours to obtain a resin which was substantially completely free from MIBK. This resin was solid at room temperature.

In a 1-liter flask equipped with a stirrer were placed 300 parts of this resin and 200 parts of STC, and heated at about 50° C. on a water bath to dissolve the resin in STC, whereby a resin composition A was obtained.

To the resin composition A was added 2 parts of 50% paste of benzoyl peroxide (hereinafter abbreviated as BPO) to obtain a resin composition B.

High-temperature curing characteristics (measurement temperature: 80° C.) according to JIS K 6901 of the resin composition B were as follows: gelation time 317 seconds, minimum curing time 580 seconds, maximum heat-build-up temperature 148° C.

The glass transition temperature of a resin cured product obtained by curing the resin composition B at 100° C. for 2 hours was 87° C. (as measured by means of a thermomechanical analyzer TMS-1 mfd. by Perkin Elmer Corp.).

Production of an electrical laminate

Kraft paper (kraft paper 140 g/m², mfd. by Sanyo-Kokusaku Pulp Co., Ltd.) was used as cellulose substrate. This kraft paper was impregnated with a solution of 35 parts of methylol melamine (Melan, a trade name, mfd. by Hitachi Chemical Company, Ltd.) dissolved in a mixture of 100 parts of methanol and 100 parts of water, and was then dried at 130° C. for 15 minutes. In this case, the weight of the paper was increased by 17.8% by weight. The thus treated substrate was impregnated with the resin composition B. Six of the substrates thus obtained were laminated, and each cellophane film was laminated on each side of the resulting laminate, after which curing was conducted at 130° C. for 15 minutes to obtain a laminate of 1.6 mm in thickness.

EXAMPLE 19

In a 2-liter flask equipped with a stirrer and a condenser was placed 750 parts of MIBK, and heated to 100° C. In a 1-liter beaker were placed 151 parts of STC, 189 parts of HEMA, 247 parts of n-butyl acrylate, 17.6 parts of AIBN and 2.9 parts of DTBP, and after mixing, the whole of the resulting mixture was added dropwise to the heated MIBK over a period of 3 hours. After completion of the dropwise addition, the reaction was carried out for 6 hours. After addition of 0.12 part of HQPC followed by mixing, 142 parts of MAC was added and the resulting mixture was subjected to reaction for another 3 hours. The reaction mixture was cooled after confirmation of substantial agreement of the acid value (measured value: 55) with the calculated value (54).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin was obtained. The resin was allowed to stand in a vacuum dryer at 80° C. for 2 hours to obtain a resin which was substantially completely free from MIBK. This resin was semisolid at room temperature.

In a 1-liter flask equipped with a stirrer were placed 300 parts of this resin and 200 parts of STC, and heated at about 50° C. on a water bath to dissolve the resin in STC, after which 2 parts of 50% paste of BPO was added to obtain a resin composition C.

High-temperature curing characteristics (measurement temperature: 80° C.) according to JIS K 6901 of the resin composition C were as follows: gelation time 230 seconds, minimum curing time 448 seconds, maximum heat-build-up temperature 182° C.

The glass transition temperature of a cured product of this resin composition was 70° C.

The resin composition C was infiltrated into the same treated substrates as in Example 18, and cured in the same manner as in Example 18 to obtain an electrical laminate.

EXAMPLE 20

In a 2-liter flask equipped with a stirrer and a condenser was placed 750 parts of MIBK, and heated to 100° C. In a 1-liter beaker were placed 200 parts of STC, 175 parts of HEMA, 222 parts of 2-ethylhexyl acrylate, 17.9 parts of AIBN and 3.0 parts of DTBP, and after mixing, the whole of the resulting mixture was added dropwise to the heated MIBK over a period of 3 hours. After completion of the dropwise addition, the reaction was carried out for 6 hours. After addition of 0.12 part of HQPC followed by mixing, 132 parts of MAC was added and the resulting mixture was subjected to reaction for another 3 hours. The reaction mixture was cooled after confirmation of substantial agreement of the acid value (measured value: 52) with the calculated value (50).

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resin was obtained. The resin was allowed to stand in a vacuum dryer at 80° C. for 2 hours to obtain a resin which was substantially completely free from MIBK. This resin was a viscous liquid at room temperature.

In a 1-liter flask equipped with a stirrer were placed 300 parts of this resin and 200 parts of STC, and heated at about 50° C. on a water bath to dissolve the resin in STC, after which 2 parts of 50% paste of BPO was added to obtain a resin composition D. High-temperature curing characteristics (measurement temperature: 80° C.) according to JIS K 6901 of the resin composition D were as follows: gelation time 214 seconds, minimum curing time 404 seconds, maximum heat-build-up temperature 194° C.

The glass transition temperature of a resin cured product of this resin composition was 51° C.

The resin composition D was infiltrated into the same treated substrates as in Example 18, and cured in the same manner as in Example 18 to obtain an electrical laminate.

COMPARATIVE EXAMPLE 4

An unsaturated polyester resin was obtained by homogeneously blending 60 parts of an unsaturated polyester obtained by condensation by heating at 210° C. of 0.4 mole of MAC, 0.6 mole of isophthalic acid and 1.1 moles of diethylene glycol with 30 parts of STC containing 0.01 part of HQPC in solution.

The glass transition temperature of a cured product of this resin was 53° C.

The resin was infiltrated into the same treated substrates as in Example 1 in the same manner as in Examples 18 to 20, and cured in the same manner as in Example 18 to obtain an electrical laminate.

Characteristics of the electrical laminates obtained in Examples 18 to 20 and Comparative Example 4 are tabulated in Table 8.

The characteristics of the electrical laminates were measured according to JIS K 6481.

TABLE 8

| Item | Unit | Example 18 | Example 19 | Example 20 | Comparative Example 4 |
|---|---|---|---|---|---|
| Water absorption | % | 0.66 | 0.73 | 0.73 | 0.75 |
| Insulation resistance after boiling | Ω | $4.0 \times 10^8$ | $5.1 \times 10^8$ | $2.9 \times 10^8$ | $2.0 \times 10^8$ |
| Flexural strength | kgf/mm$^2$ | 16.9 | 16.0 | 14.5 | 12.9 |
| Flexural modulus | " | 950 | 780 | 756 | 525 |
| Dielectric loss tangent | 1 KHz | — | 0.0184 | 0.0163 | 0.0174 | 0.0210 |
| | 1 MHz | — | 0.0340 | 0.0350 | 0.0320 | 0.0350 |
| Dielectric constant | 1 KHz | — | 4.6 | 4.5 | 4.2 | 4.8 |
| | 1 MHz | — | 4.1 | 4.2 | 3.9 | 4.5 |

EXAMPLE 21

In a 2-liter flask equipped with a stirrer and a condenser was placed 750 parts of MIBK, and heated to 100° C. In a 1-liter beaker were placed 378 parts of STC, 186 parts of methacrylic acid (hereinafter referred to as MAA), 186 parts of n-butyl acrylate, 17.6 parts of AIBN and 2.9 parts of DTBP, and after mixing, the whole of the resulting mixture was added dropwise to the heated MIBK over a period of 3 hours. After completion of the dropwise addition, the reaction was carried out for 6 hours, and 0.12 part of HQPC was added, followed by mixing. Then, 290 parts of glycidyl methacrylate and 10 parts of trimethylbenzylammonium chloride were added, and the resulting mixture was subjected to reaction for another 5 hours. The reaction mixture was cooled at the time when an acid value (measured value: 14) was reached.

In a 1-liter flask equipped with a stirrer and a condenser was placed 750 parts of the reaction mixture, and heated at 80° to 100° C. while reducing the pressure to about 250 mmHg by means of an aspirator, to remove the MIBK, whereby a resion composition was obtained.

The resin composition was allowed to stand in a vacuum dryer at 60° C. for 3 hours to obtain a resin composition which was substantially completely free from MIBK. This resin composition was semisolid at room temperature.

In a 1-liter flask equipped with a stirrer were placed 300 parts of this resin composition and 200 parts of STC, and heated at about 50° C. on a water bath to dissolve the resin composition in STC, after which 2 parts of 50% paste of BPO was added to obtain a resin composition E.

The resin composition E was infiltrated into the same treated substrates as in Example 18, and cured in the same manner as in Example 18 to obtain an electrical laminate.

EXAMPLE 22

In a 2-liter flask equipped with a stirrer and a condenser was placed 750 parts of MIBK, and heated to 100° C. In a 1-liter beaker were placed 377 parts of STC, 202 parts of HEMA, 17.4 parts of AIBN and 2.9 parts of DTBP, and after mixing, the whole of the resulting mixture was added dropwise to the heated MIBK over a period of 3 hours. After completion of the dropwise addition, the reaction was carried out for 6 hours, and 0.12 part of HQPC was added, followed by cooling.

The flask was connected to an aspirator, and the contents of the flask were heated at 80° to 100° C. while reducing the pressure to about 250 mmHg by means of the aspirator, to remove the MIBK. The pressure was further reduced to 5 mmHg by means of a vacuum pump to remove the MIBK completely.

The resin composition thus obtained was cooled to 60° C. and sufficiently dissolved in 440 parts of STC previously dehydrated by use of calcium chloride. At the time when a STC solution at 60° C. had been formed, 1.0 part of dibutyltin dilaurate was placed in the flask, after which 63 parts of isocyanatoethyl methacrylate was added dropwise over a period of about 30 minutes. Thereafter, the resulting mixture was stirred for 30 minutes while keeping the same warm, and then cooled.

Thereto was further added 2 parts of 50% paste of BPO to obtain a resin composition F.

The resin composition F was infiltrated into the same treated substrates as in Example 18, and cured in the same manner as in Example 18 to obtain an electrical laminate.

Characteristics of the electrical laminates obtained in Examples 21 to 22 are tabulated in Table 9. The characteristics of the electrical laminates were measured according to JIS C 6481.

EXAMPLES 23 to 26

In a 300-ml flask equipped with a stirrer, a heating device, a condenser, a nitrogen gas inlet, and a monomer inlet was placed 100 parts of MIBK, and heated to 100° C. while replacing the air in the flask sufficiently with nitrogen. In a 200-ml beaker were placed each component A listed in Table 10, 3 parts of AIBN and 0.5 part of DTBP, and after sufficient mixing, the whole of the resulting mixture was continuously added to the heated MIBK over a period of 3 hours. After completion of the addition of the whole mixture, the reaction was carried out for another 3 hours, and 0.02 part of HQPC was added, followed by mixing, whereby 9 copolymers were prepared. The component B (maleic anhydride) listed in Table 10 was further added to each mixture thus obtained, while maintaining the temperature of the mixture at 100° C., and the resulting mixture was subjected to reaction for 4 hours and then cooled. The polymerization conversions of the reaction mixtures thus obtained were all 90% or more.

Subsequently, a condenser was attached to the flask, and each reaction mixture was heated at 80° to 100° C. while reducing the pressure by means of an aspirator gradually to about 50 mmHg, to remove the MIBK. Then, each component C listed in Table 10 containing 0.02 part of HQPC previously dissolved therein was added, and stirring was continued until the residue was sufficiently dissolved. After it was confirmed that no insoluble material existed, the solution thus obtained was cooled, whereby 4 resin compositions were obtained.

TABLE 9

| Item | Unit | Example 21 | Example 22 | Comparative Example 4 |
|---|---|---|---|---|
| Water absorption | % | 0.58 | 0.67 | 0.75 |
| Insulation resistance after boiling | Ω | $3.5 \times 10^8$ | $4.5 \times 10^8$ | $2.0 \times 10^8$ |
| Flexural strength | kgf/mm$^2$ | 15.3 | 14.2 | 12.9 |
| Flexural modulus | " | 625 | 583 | 525 |
| Dielectric loss tangent | 1 KHz | — | 0.0195 | 0.0180 | 0.0210 |
| | 1 MHz | — | 0.0330 | 0.0310 | 0.0350 |
| Dielectric constant | 1 KHz | — | 4.2 | 4.1 | 4.8 |
| | 1 MHz | — | 3.8 | 3.8 | 4.5 |

TABLE 10

| Example | 23 | 24 | 25 | 26 |
|---|---|---|---|---|
| A | | | | |
| Styrene | 22 (30 mole %) | 19 (30 mole %) | 25 (30 mole %) | 22 (30 mole %) |
| Butyl acrylate | 36 (40 mole %) | — | — | 36 |
| 2-Ethylhexyl acrylate | — | 45 (40 mole %) | — | — |
| Methyl methacrylate | — | — | 30 (40 mole %) | — |
| 2-Hydroxyethyl methacrylate | 28 (30 mole %) | 24 (30 mole %) | 30 (30 mole %) | 28 (30 mole %) |
| B | | | | |
| Maleic anhydride | 14 | 12 | 15 | 14 |
| C | | | | |
| Styrene | 100 | 100 | 100 | 80 |
| Butyl acrylate | — | — | — | 20 |

(the unit of the figures: parts by weight)

With 100 parts of each resin composition was mixed 1 part of Perhexa 3M (a peroxyketal, a trade name, mfd. by Nippon Oils and Fats Co., Ltd.), and then the resulting composition was infiltrated into the same treated paper as in Example 18. Five of the substrates thus treated were laminated and a cellophane film was laminated on each side of the resulting laminate, after which curing was conducted at 150° C. for 15 minutes to obtain a laminate of 1.6 mm in thickness.

Characteristics of the laminates thus obtained are shown in Table 11. The characteristics were measured according to JIS C 6481.

TABLE 11

| Item | | Unit | Example 23 | Example 24 | Example 25 | Example 26 |
|---|---|---|---|---|---|---|
| Water absorption | | % | 0.72 | 0.70 | 0.67 | 0.73 |
| Insulation resistance after boiling | | Ω | $4.8 \times 10^8$ | $3.0 \times 10^8$ | $4.0 \times 10^8$ | $4.0 \times 10^8$ |
| Flexural strength | | kgf/mm$^2$ | 16.2 | 13.5 | 16.7 | 14.9 |
| Flexural modulus | | " | 780 | 740 | 890 | 700 |
| Dielectric loss tangent | 1 KHz | — | 0.0160 | 0.0175 | 0.0178 | 0.0170 |
| | 1 MHz | — | 0.0340 | 0.0325 | 0.0320 | 0.0350 |
| Dielectric constant | 1 KHz | — | 4.3 | 4.2 | 4.4 | 4.3 |
| | 1 MHz | — | 4.1 | 4.0 | 4.2 | 4.1 |

EXAMPLES 27 to 31

In a 4-liter flask equipped with a stirrer and a condenser was placed 556 parts of MIBK, and heated to 100° C. On the other hand, 358 parts of STC, 588 parts of n-butyl acrylate, 448 parts of HEMA, 41.9 parts of AIBN and 7.0 parts of DTBP were placed in a 2-liter beaker and mixed. Then, the resulting mixture was added dropwise to the heated MIBK so as to exhaust the whole of the mixture in 3 hours. After completion of the dropwise addition of the whole, the reaction was carried out for another 3 hours, and 0.27 part of hydroquinone was added, followed by adding thereto 225 parts of maleic anhydride while maintaining the temperature at 100° C. The resulting mixture was subjected to reaction for 4 hours and then cooled after it was confirmed that the polymerization conversion was 98%.

Subsequently, an aspirator was attached to the flask, and the reaction mixture was heated at 80° to 100° C. while reducing the pressure gradually to about 5 mmHg by means of the aspirator, to remove the MIBK. Then, the pressure was further reduced to 5 mmHg by means of a vacuum pump, whereby the MIBK was completely removed.

Next, 1618.8 parts of styrene containing 0.02 part of hydroquinone previously dissolved therein was added, and stirring was continued until the copolymer was completely dissolved. After it was confirmed that no insoluble material existed, the reaction mixture was cooled to obtain a resin composition. The nonvolatile content (NV) of this resin composition was about 52.

Divinylbenzene was added to 100 parts of this resin composition in each amount shown in Table 12, followed by adding thereto 1 part of Perhexa 3M (a peroxyketal, a trade name, mfd. by Nippon Oils and Fats Co., Ltd.), and after sufficient stirring and mixing, high-temperature curing characteristics (measurement temperature 130° C.: in Table 12, Tg denotes gelation time, Tc minimum curing time, and Tmax maximum heat-build-up temperature) of the resin compositions thus obtained were measured according to JIS K 6901.

Subsequently, each of these resin compositions was infiltrated into the same treated paper as in Example 18 and five of the substrates thus treated were laminated, after which a cellophane film was laminated on each side of the resulting laminate, and curing was conducted at 150° C. for 15 minutes to obtain a laminate of 1.6 mm in thickness.

Next, each of the laminates thus obtained was finely ground and about 3 g of the ground laminate was placed in a thimble having a diameter of 28 mm and a length of 100 mm whose weight had previously been made constant by drying. The thimble containing the ground laminate was precisely weighed and then subjected to extraction under reflux for 4 hours by means of a Soxhlet extractor using acetone (100 g) as solvent. After the extraction, the thimble was dried in a vacuum dryer at 60° C. for 4 hours and the acetone extraction rate (% by weight) was calculated from the difference of the weights of the thimble before and after the extraction and drying. The filtrate was subjected as such to quantitative analysis for unreacted styrene monomer by means of a gas-chromatographic apparatus (Model 164 mfd. by Hitachi, Ltd.), and the amount of residual styrene (% by weight) was calculated from the analysis result. The results obtained are summarized in Table 12.

TABLE 12

| | Adding amount (parts) | High-temperature curing characteristics | | | Acetone extraction rate (%) | Amount of residual styrene (wt %) |
|---|---|---|---|---|---|---|
| | | Tg (sec) | Tc (sec) | Tmax (°C.) | | |
| Comparative Example 5 | 0 | 118 | 170 | 235 | 10.1 | 0.065 |
| Example 27 | 0.5 | 115 | 166 | 235 | 7.2 | 0.058 |
| Example 28 | 1.0 | 116 | 158 | 247 | 5.0 | 0.055 |
| Example 29 | 2.5 | 116 | 152 | 253 | 4.3 | 0.043 |
| Example 30 | 5.0 | 115 | 151 | 266 | 4.1 | 0.035 |
| Example 31 | 10.0 | 122 | 151 | 277 | 3.0 | 0.031 |

COMPARATIVE EXAMPLE 5

To 100 parts of each of the resin compositions prepared in Examples 27 to 31 was added 1 part of Perhexa 3M (a peroxyketal, a trade name, mfd. by Nippon Oils and Fats Co., Ltd.), but not divinylbenzene. After sufficient stirring and mixing, high-temperature curing characteristics (130° C.) of the resin compositions thus obtained were measured in the same manner as in Examples 27 to 31. In addition, laminates were produced in the same manner as in Examples 27 to 31 and the acetone extraction rate (% by weight) and the amount of residual styrene (% by weight) were measured in the same manner as in Examples 27 to 31.

Next, in Table 13 are tabulated characteristics of laminates obtained when the adding amount of divinylbenzene was 0 part, 2.5 parts or 10 parts.

The punchability was measured according to ASTM D-617-44. Formation of good punched holes is expressed by partial blanching by ply separation or formation of cracks not connecting holes with one another by Δ, and remarkable partial blanching by ply separation or formation of cracks connecting holes with one another by X.

EXAMPLES 32 to 36

Ethylene glycol dimethacrylate was added to 100 parts of each of the resin compositions prepared in Examples 27 to 31, in each amount shown in Table 14, followed by adding thereto 1 part of Perhexa 3M (a peroxyketal, a trade name, mfd. by Nippon Oils and Fats Co., Ltd.). After sufficient stirring and mixing, high-temperature curing characteristics (130° C.) of the resin compositions thus obtained were measured in the same manner as in Examples 27 to 31. In addition, in the same manner as in Examples 27 to 31, laminates were produced and the acetone extraction rate and the amount of residual styrene were measured. The results obtained are summarized in Table 14.

TABLE 14

| | Adding amount (parts) | High-temperature curing characteristics Tg (sec) | Tc (sec) | Tmax (°C.) | Acetone extraction rate (wt %) | Amount of residual styrene (wt %) |
| --- | --- | --- | --- | --- | --- | --- |
| Example 32 | 0.5 | 118 | 169 | 237 | 7.3 | 0.057 |
| Example 33 | 1.0 | 119 | 168 | 243 | 5.0 | 0.050 |
| Example 34 | 2.5 | 121 | 165 | 250 | 4.2 | 0.048 |
| Example 35 | 5.0 | 123 | 162 | 258 | 4.0 | 0.040 |
| Example 36 | 10.0 | 125 | 161 | 268 | 3.7 | 0.033 |

EXAMPLES 37 to 41

Triallyl isocyanurate was added to 100 parts of each of the resin compositions prepared in Examples 27 to 31, in each amount shown in Table 15, followed by adding thereto 1 part of Perhexa 3M (a peroxyketal, a trade name, mfd. by Nippon Oils and Fats Co., Ltd.). After sufficient stirring and mixing, high-temperature curing characteristics (130° C.) of the resin compositions thus obtained were measured in the same manner as in Examples 27 to 31. In addition, in the same manner as in Examples 27 to 31, laminates were produced and the acetone extraction rate and the amount of residual styrene were measured. The results obtained are summarized in Table 15.

TABLE 13

| Item | Unit | Comparative Example 5 | Example 29 | Example 31 |
| --- | --- | --- | --- | --- |
| Adding amount of divinylbenzene (parts) | | 0 | 2.5 | 10 |
| Water absorption | % | 0.70 | 0.65 | 0.61 |
| Flexural strength | kgf/mm² | 14.4 | 14.0 | 13.5 |
| Flexural modulus | " | 680 | 699 | 741 |
| Dielectric loss tangent | 1 KHz | 0.0118 | 0.0115 | 0.0120 |
| | 1 MHz | 0.0335 | 0.0322 | 0.0345 |
| Dielectric constant | 1 KHz | 4.7 | 4.6 | 4.5 |
| | 1 MHz | 4.3 | 4.2 | 4.2 |
| Punchability (surface temp. °C.) | 20° C. | O | O | O |
| | 40° C. | O | O | O |
| | 60° C. | O | O | O~Δ |
| | 80° C. | O | O | Δ |

TABLE 15

| | Adding amount (parts) | High-temperature curing characteristics Tg (sec) | Tc (sec) | Tmax (°C.) | Acetone extraction rate (%) | Amount of residual styrene (%) |
| --- | --- | --- | --- | --- | --- | --- |
| Example 37 | 0.5 | 122 | 174 | 239 | 8.2 | 0.060 |
| Example 38 | 1.0 | 125 | 178 | 243 | 6.5 | 0.051 |
| Example 39 | 2.5 | 129 | 182 | 247 | 5.0 | 0.048 |
| Example 40 | 5.0 | 133 | 186 | 253 | 4.1 | 0.040 |
| Example 41 | 10.0 | 138 | 190 | 257 | 4.1 | 0.039 |

As shown in Tables 13 to 15, by virtue of the addition of each polyfunctional monomer, the laminates obtained in Examples 27 to 31 are reduced in both acetone extraction rate and the amount of residual styrene which are measures of the degree of cure, and they are excellent in curing property and show favorable values well balanced between electrical characteristics and mechanical properties.

The electrical laminate of the present invention has excellent electrical characteristics, for example, a slight lowering of insulation resistance value after boiling and excellent dielectric properties, and moreover has excellent mechanical properties.

What is claimed is:

1. A laminate for electrical use obtained by impregnating one or more substrates with a resin composition comprising
   (A) 80 to 20 parts by weight of a copolymer having carbon-carbon unsaturated bonds in its side chains and obtained by reacting (i) a copolymer obtained by copolymerizing 0 to 50% by mole of an alkyl acrylate or alkyl methacrylate, 10 to 50% by mole of a hydroxyalkyl acrylate or a hydroxyalkyl methacrylate, and 0 to 90% by mole of an ethylenically unsaturated monomer, a total being 100% by mole, with (ii) an unsaturated carboxylic acid or an anhydride thereof, and
   (B) 20 to 80 parts by weight of a monomer copolymerizable with (A), a total of (A) and (B) being 100 parts by weight, and
   curing the resin impregnated substrates.

2. A laminate for electrical use obtained by impregnating one or more substrates with a resin composition comprising
   (A) 80 to 20 parts by weight of a copolymer having carbon-carbon unsaturated bonds in its side chains and obtained by reacting (i) a copolymer obtained by copolymerizing 0 to 50% by mole of an alkyl acrylate or alkyl methacrylate, 10 to 50% by mole of a hydroxyalkyl acrylate or a hydroxyalkyl methacrylate, and 0 to 90% by mole of an ethylenically unsaturated monomer, a total being 100% by mole, with (ii) an unsaturated carboxylic acid or an anhydride thereof,
   (B) 20 to 80 parts by weight of a monomer copolymerizable with (A), a total of (A) and (B) being 100 parts by weight, and
   (C) 0.5 part by weight or more of a polyfunctional crosslinking monomer based on 100 parts by weight of (A) and (B), and
   curing the resin impregnated substrates.

3. A laminate according to claim 2, wherein in (A), the alkyl acrylate or methacrylate is butyl acrylate, the hydroxyalkyl acrylate or methacrylate is 2-hydroxyethyl methacrylate, the ethylenic unsaturated monomer is styrene and the unsaturated carboxylic acid or an anhydride thereof is maleic anhydride, and in (B) the copolymerizable monomer is styrene.

4. A laminate according to claim 2, wherein the one or more substrates are sheet-like substrates.

5. A laminate according to claim 4, wherein the sheet-like substrates are material selected from the group consisting of glass cloth, glass mate, asbestos cloth, organic fiber, nonwoven fabric and paper.

6. A laminate according to claim 1, wherein the one or more substrates impregnated with the resin composition are placed one upon the other and laminated together by passage between rolls and thereafter the resulting laminate is heated to cure the resin impregnated substrates.

7. A prepeg obtained by impregnating a substrate with a resin composition comprising
   (A) 80 to 20 parts by weight of a copolymer having carbon-carbon unsaturated bonds in it side chains and obtained by reacting (i) a copolymer obtained by copolymerizing 0 to 50% by mole of an alkyl acrylate or alkyl methacrylate, 10 to 50% by mole of a hydroxyalkyl acrylate or a hydroxyalkyl methacrylate, and 0 to 90% by mole of an ethylenically unsaturated monomer, a total being 100% by mole, with (ii) an unsaturated carboxylic acid or an anhydride thereof, and
   (B) 20 to 80 parts by weight of a monomer copolymerizable with (A), a total of (A) and (B) being 100 parts by weight.

8. A prepeg obtained by impregnating a substrate with a resin composition comprising
   (A) 80 to 20 parts by weight of a copolymer having carbon-carbon unsaturated bonds in its side chains and obtained by reacting (i) a copolymer obtained by copolymerizing 0 to 50% by mole of an alkyl acrylate or alkyl methacrylate, 10 to 50% by mole of a hydroxyalkyl acrylate or a hydroxyalkyl methacrylate, and 0 to 90% by mole of an ethylenically unsaturated monomer, a total being 100% by mole, with (ii) an unsaturated carboxylic acid or an anhydride thereof,
   (B) 20 to 80 parts by weight of a monomer copolymerizable with (A), a total of (A) and (B) being 100 parts by weight, and
   (C) 0.5 part by weight or more of a polyfunctional crosslinking monomer based on 100 parts of (A) and (B).

9. A prepreg according to claim 8, wherein in (A), the alkyl acrylate or methacrylate is butyl acrylate, the hydroxyalkyl acrylate or methacrylate is 2-hydroxyethyl methacrylate, the ethylenic unsaturated monomer is styrene and the unsaturated carboxylic acid or an anhydride thereof is maleic anhydride, and in (B) the copolymerizable monomer is styrene.

10. A prepeg according to claim 7, wherein the one of more substrates are sheet-like substrates.

11. A prepeg according to claim 10, wherein the sheet-like substrates are material selected from the group consisting of glass cloth, glass mat, asbestos cloth, organic fiber, nonwoven fabric and paper.

12. A prepeg according to claim 10, wherein the one or more substrates impregnated with the resin composition are placed one upon the other and laminated together by passage between rolls and thereafter the resulting laminate is heated to cure the resin impregnated substrates.

* * * * *